United States Patent
Yang

(10) Patent No.: US 8,030,945 B2
(45) Date of Patent: Oct. 4, 2011

(54) GROUP OF CIRCUITS AND TESTING METHOD THEREOF AND TESTING MACHINE THEREOF

(75) Inventor: Cheng-Kuang Yang, Taichung County (TW)

(73) Assignee: Winbond Electronics Corp., Taichung (TW)

( * ) Notice: Subject to any disclaimer, the term of this patent is extended or adjusted under 35 U.S.C. 154(b) by 730 days.

(21) Appl. No.: 12/170,122

(22) Filed: Jul. 9, 2008

(65) Prior Publication Data

US 2010/0007353 A1    Jan. 14, 2010

(51) Int. Cl.
*G01R 31/02* (2006.01)
*G01R 19/00* (2006.01)
(52) U.S. Cl. .................................. 324/537; 324/76.11
(58) Field of Classification Search .................. 324/537, 324/76.11
See application file for complete search history.

(56) References Cited

U.S. PATENT DOCUMENTS

| 7,400,996 B2 * | 7/2008 | Percer et al. ................... 702/120 |
| 2007/0200832 A1 * | 8/2007 | Cho et al. ...................... 345/173 |

* cited by examiner

*Primary Examiner* — Amy He
(74) *Attorney, Agent, or Firm* — J.C. Patents

(57) ABSTRACT

A Group of circuits and a testing method thereof and a testing machine thereof are provided. In the testing method, a first voltage of a first circuit is adjusted to be a second voltage according to a first adjusting signal, wherein the second voltage is closer to a standard voltage compared to the first voltage. Further, a third voltage of a second circuit is adjusted to be a forth voltage according to a second adjusting signal, and the forth voltage is closer to the standard voltage compared to the third voltage. In addition, a margin range of the second voltage and a margin range of the forth voltage are adjusted together according to a margin adjusting signal. Thereby, time required for testing the first circuit and the second circuit can be decreased, so as to lower the cost.

10 Claims, 5 Drawing Sheets

GROUP OF CIRCUITS AND TESTING METHOD THEREOF AND TESTING MACHINE THEREOF

BACKGROUND OF THE INVENTION

1. Field of the Invention

The present invention relates to a testing technique for a group of circuits. More particularly, the present invention relates to a testing technique for margin voltages of a plurality of circuits.

2. Description of Related Art

For most of integrated circuits (ICs), direct current (DC) voltage generators are generally applied therein. If the DC voltage generator provides an unsuitable voltage to the IC, it may lead to malfunction of the IC. Therefore, when fabrication of the IC is completed, the IC is generally tested to guarantee a production yield thereof. In the following content, a conventional circuit testing technique is described in detail with reference of a figure.

FIG. 1 is a schematic diagram illustrating a conventional method of adjusting voltages of a DC voltage generator via a fuse technique. Referring to FIG. 1, a circuit 11 includes a DC voltage generator 101 and a test mode trim unit 102. The DC voltage generator 101 is used for providing a DC voltage V1. The test mode trim unit 102 may trim the DC voltage V1 into a plurality of testing voltages Vout for testing whether or not the circuit 11 can work normally.

First, assuming an optimal working voltage of the circuit 11 is 2.5V, and a margin voltage thereof is 2.3V~2.7V. Moreover, assuming the test mode trim unit 102 has 8 test modes shown as table 1.

TABLE 1 the test modes of the test mode trim unit 102

| Test mode | | | Shifting amount of the DC voltage V1 |
|---|---|---|---|
| 0 | 1 | 1 | −0.2 V |
| 0 | 1 | 0 | −0.1 V |
| 0 | 0 | 1 | −0.05 V |
| 0 | 0 | 0 | 0 V |
| 1 | 0 | 0 | +0.05 V |
| 1 | 0 | 1 | +0.1 V |
| 1 | 1 | 0 | +0.15 V |
| 1 | 1 | 1 | +0.2 V |

Generally, testing the circuit includes two stages, and in a first stage thereof, a testing voltage closest to the optimal working voltage is supplied to the circuit 11 for testing whether or not the circuit 11 can work normally. In a second stage, a margin voltage is supplied to the circuit 11 for testing whether or not the circuit 11 can work normally, so as to ensure a quality of the circuit 11.

Assuming the DC voltage V1 generated by the DC voltage generator 101 is 2.65V, in the first stage of circuit testing, to simulate whether or not the circuit 11 can work normally under the optimal working voltage, the test mode of the test mode trim unit 102 can be set to "0, 1, 0", so as to shift the DC voltage V1 by −0.1V, and supply a 2.55V testing voltage to the circuit 11. Next, whether or not the circuit 11 can work normally under the margin voltage is tested. If the circuit 11 can work normally, it represents the circuit 11 can be repaired via the fuse technique, and if the circuit 11 cannot work normally, it represents the circuit 11 has a defect and cannot be shipped, so that purchase of malfunctioned circuits by customers can be avoided.

As described above, in the second stage of the circuit testing, to simulate whether or not the circuit 11 can work normally under the margin voltage, the test mode of the test mode trim unit 102 can be set to "1, 0, 0", so as to shift the DC voltage V1 by +0.05V, and supply the 2.7V testing voltage Vout to the circuit 11. Therefore, whether or not the circuit 11 can work normally under the 2.7V margin voltage may be simulated by applying the 2.7V testing voltage Vout.

As described above, the test mode of the test mode trim unit 102 can be further changed to "0, 1, 1", so as to shift the DC voltage V1 by −0.2V, and supply the 2.45V testing voltage to the circuit 11. Therefore, whether or not the circuit 11 can work normally under the 2.3V margin voltage may be simulated by applying the 2.45V testing voltage Vout. It should be noted that due to limitation of the test mode trim unit 102, it cannot provide the 2.3V testing voltage for simulating whether or not the circuit 11 can work normally under the 2.3V margin voltage. In other words, the aforementioned method cannot ensure that the circuit may work normally under the voltages 2.3V~2.45V.

Besides, assuming there are one hundred circuits 11 required to be tested, since the DC voltages V1 generated by the DC voltage generators 101 of the circuits 11 are slightly different with each other, when the circuits are tested, the test mode trim units 102 of the one hundred circuits 11 have to be set one by one to generate suitable testing voltages. In detail, according to the conventional method, assuming testing time spent at the first stage and the second stage for testing each of the circuits 11 are respectively T1 and T2, a total time spent for testing the one hundred circuits 11 is then 100×(T1+T2). Therefore, the conventional method is very time-consuming and cost-consuming.

Referring to FIG. 1 again, assuming there are one hundred circuits 11 to be tested, to shorten the total time spent for testing the circuits 11, another method is provided according to the conventional method, and the method may be described as follows. In the first stage of the circuit testing, the 2.5V testing voltages V1 are simultaneously supplied to the one hundred circuits 11 by a testing machine (not shown), so as to test in parallel whether or not the one hundred circuits can work normally.

As described above, in the second stage of the circuit testing, first, the 2.3V testing voltages V1 are simultaneously supplied to the one hundred circuits 11 by the testing machine, so as to test in parallel whether or not the one hundred circuits can work normally. Next, the 2.7V testing voltages V1 are simultaneously supplied to the one hundred circuits 11 by the testing machine, so as to test in parallel whether or not the one hundred circuits can work normally. Though such method can reduce the total time spent for testing the circuits, it cannot ensure that the DC voltage generators 101 of the one hundred circuits 11 can work normally. In other words, if the DC voltage generator 101 of the circuit 11 has a defect, the circuit 11 then cannot work normally, and the conventional method cannot detect such defect of the DC voltage generator 101.

Moreover, since the testing voltage V1 provided by the testing machine is stable and has a powerful driving capability, if the circuit 11 has a defect such as current leakage, etc., shifting of the testing voltage V1 may still not occur. In other words, if the circuit 11 has the defect such as current leakage, etc., though the DC voltage generator 101 of the circuit 11 may provide the 2.5V working voltage to the circuit 11, the working voltage provided by the DC voltage generator 101 is shifted (for example, shifted to 2.0V) due to the current leakage of the circuit 11, so that the circuit 11 probably cannot work normally, and the conventional method cannot detect such defect, either.

SUMMARY OF THE INVENTION

The present invention is directed to a group of circuits, which may improve a testing yield of the circuits.

The present invention is directed to a testing method for a group of circuits, by which a plurality of circuits can be tested in parallel, so as to save a testing cost.

The present invention is directed to a testing machine, which may test in parallel a plurality of circuits of a group of circuits, so as to shorten a testing time and reduce a testing cost.

The present invention provides a testing method for a group of circuits. The group of circuits at least includes a first circuit and a second circuit. The testing method can be described as follows. A first voltage of a first circuit is adjusted to be a second voltage according to a first adjusting signal, wherein the second voltage is closer to a standard voltage compared to the first voltage. Further, a third voltage of a second circuit is adjusted to be a forth voltage according to a second adjusting signal, and the forth voltage is closer to the standard voltage compared to the third voltage. In addition, a margin range of the second voltage and a margin range of the forth voltage are adjusted together according to a margin adjusting signal.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2:
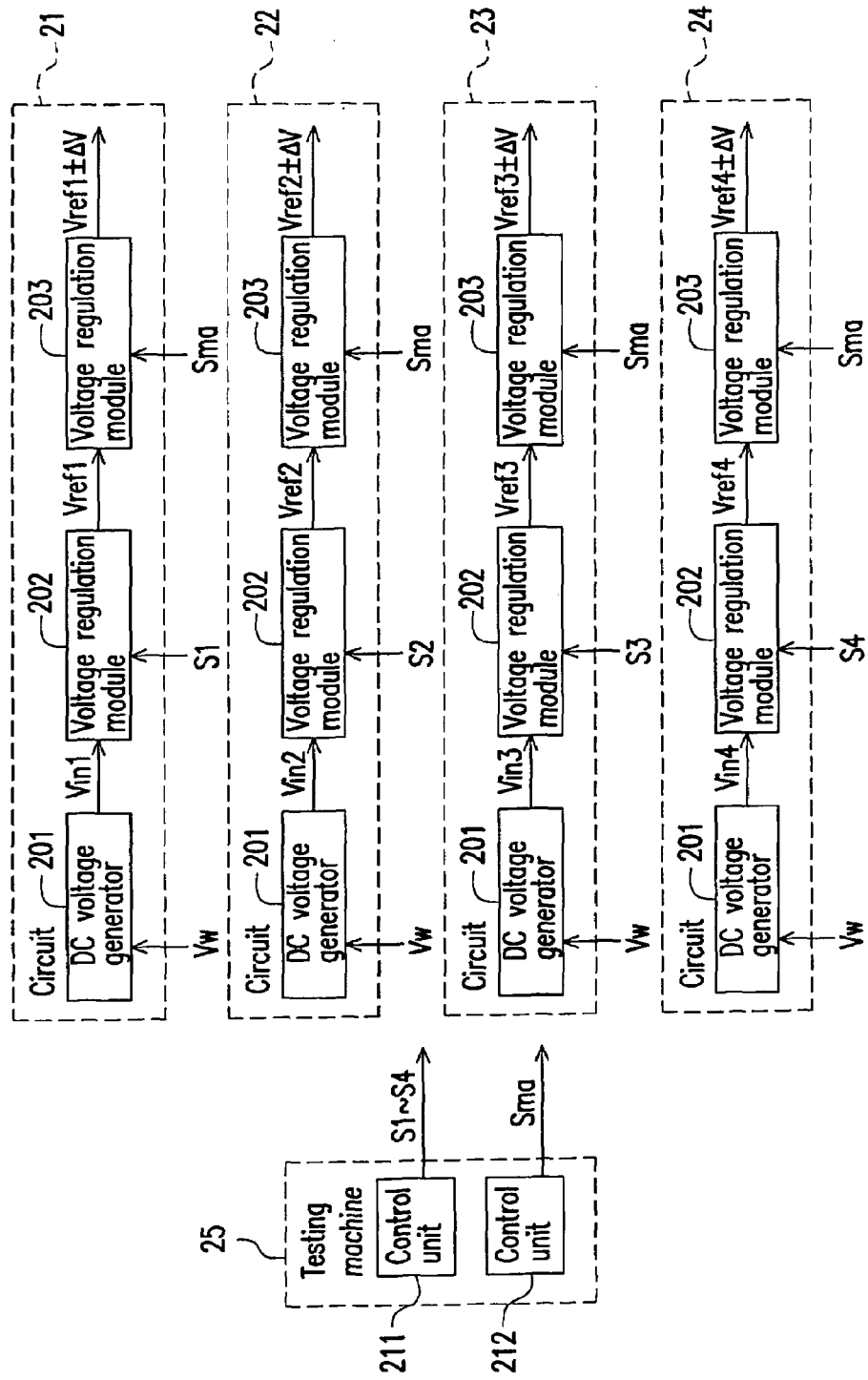
FIG. 2 is a schematic diagram illustrating a group of circuits and a testing machine thereof according to an embodiment of the present invention.

FIG. 2 is a schematic diagram illustrating a group of circuits and a testing machine thereof according to an embodiment of the present invention. Referring to FIG. 2, in the present embodiment, the group of circuit includes circuits 21~24. On the other hand, the testing machine 25 includes control units 211 and 212. In the present embodiment, the circuits 21~24 respectively include a DC voltage generator 201 and voltage regulation modules 202 and 203.

In the circuit 21, the DC voltage generator 201 receives a working voltage Vw for generating a voltage Vin1. The voltage regulation module 202 of the circuit 21 adjusts the voltage Vin1 to be a voltage Vref1 close to a standard voltage according to an adjusting signal S1 provided by the control unit 211. Moreover, the voltage regulation module 203 of the circuit 21 adjusts a margin range of the voltage Vref1 according to a margin adjusting signal Sma provided by the control unit 212. To be specific, the voltage regulation module 203 of the circuit 21 adjusts the voltage Vref1 to be a voltage Vref1±ΔV according to the margin adjusting signal Sma.

Similarly, in the circuit 22, the DC voltage generator 201 receives a working voltage Vw for generating a voltage Vin2. The voltage regulation module 202 of the circuit 22 adjusts the voltage Vin2 to be a voltage Vref2 close to the standard voltage according to an adjusting signal S2 provided by the control unit 211. Moreover, the voltage regulation module 203 of the circuit 22 adjusts a margin range of the voltage Vref2 according to a margin adjusting signal Sma provided by the control unit 212. To be specific, the voltage regulation module 203 of the circuit 22 adjusts the voltage Vref2 to be a voltage Vref2±ΔV according to the margin adjusting signal Sma. Operations of the circuits 23 and 24 can be deduced by analogy, and therefore detailed descriptions thereof will not be repeated.

It should be noted that according to a current technique, the DC voltage generators 201 cannot generate accurate voltages. Therefore, the voltages Vin1~Vin4 generated by the DC voltage generators 201 of the circuits 2124 are slightly different, and accordingly the voltages Vref1 Vref4 and the voltages Vref1±ΔV~Vref4±ΔV are also slightly different.

On the other hand, the control unit 211 of the testing machine 25 respectively couples to the voltage regulation modules 202 of the circuits 21~24. The control unit 211 respectively generates the adjusting signals S1~S4 according to the voltages Vin1~Vin4 of the circuits 21~24, so as to respectively control the voltage regulation modules 202 of the circuits 21~24. Moreover, the control unit 212 of the testing machine 25 respectively couples to the voltage regulation modules 203 of the circuits 21~24. The control unit 212 generates the margin adjusting signal Sma for controlling the voltage regulation modules 203 of the circuits 21~24 together.

Figure 3:
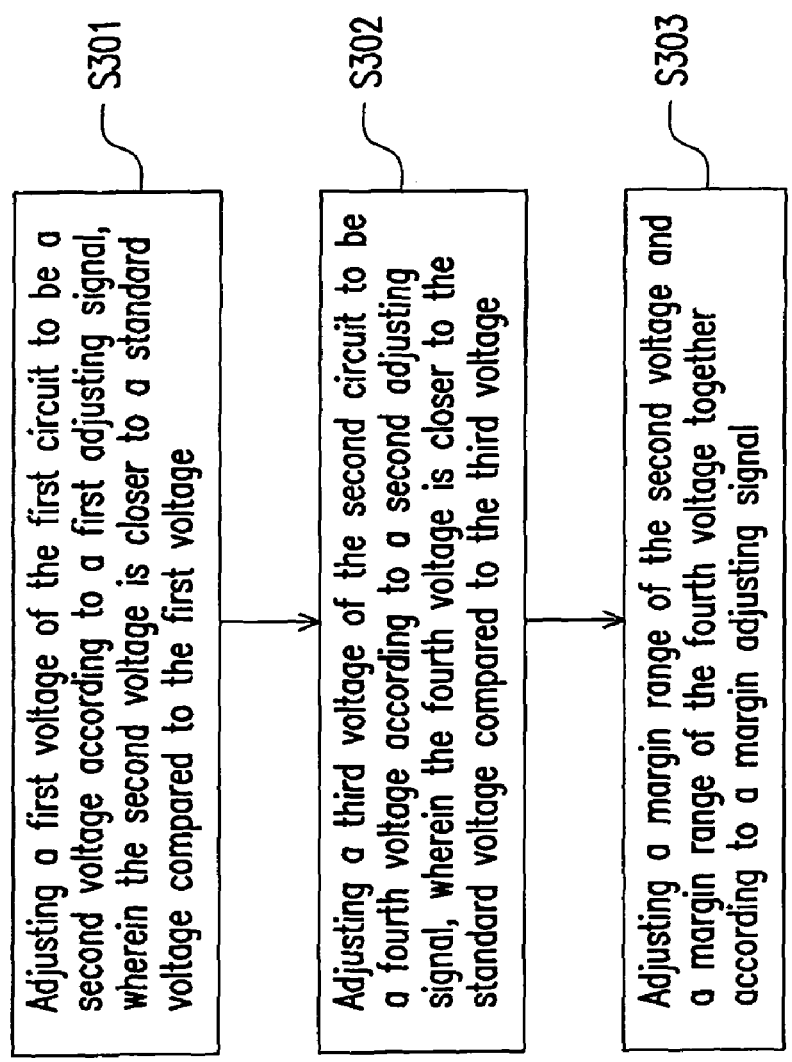
FIG. 3 is a flowchart illustrating a testing method for a group of circuits according to an embodiment of the present invention.

FIG. 3 is a flowchart illustrating a testing method for a group of circuits according to an embodiment of the present invention. Referring to FIG. 2 and FIG. 3, in the present embodiment, assuming an optimal working voltage of the circuits 21~24 is 2.5V, and the margin voltage thereof is 2.3V~2.7V. Moreover, assuming the voltage regulation module 202 has 8 regulation modes shown as table 2, and assuming the voltage regulation module 203 also has 8 regulation modes shown as table 3.

TABLE 2 regulation modes and voltage regulation amount of the voltage regulation module 202:

| Regulation mode | | | Voltage regulation amount |
| --- | --- | --- | --- |
| 0 | 1 | 1 | −0.2 V |
| 0 | 1 | 0 | −0.1 V |
| 0 | 0 | 1 | −0.05 V |
| 0 | 0 | 0 | 0 V |
| 1 | 0 | 0 | +0.05 V |
| 1 | 0 | 1 | +0.1 V |
| 1 | 1 | 0 | +0.15 V |
| 1 | 1 | 1 | +0.2 V |

TABLE 3 regulation modes and regulation amount of the voltages of the voltage regulation module 203:

| Regulation mode | | | Voltage regulation amount |
|---|---|---|---|
| 0 | 1 | 1 | +0.3 V |
| 0 | 1 | 0 | +0.2 V |
| 0 | 0 | 1 | +0.1 V |
| 0 | 0 | 0 | 0 V |
| 1 | 0 | 0 | −0.1 V |
| 1 | 0 | 1 | −0.2 V |
| 1 | 1 | 0 | −0.3 V |
| 1 | 1 | 1 | −0.4 V |

In the present embodiment, testing the circuits 21~24 of the group of circuits includes two stages, and in a first stage thereof, whether or not the circuits 21~24 can work normally under the optimal working voltage is simulated. In a second stage, whether or not the circuits 21~24 can work normally under the margin voltage is simulated. In the following content, the first stage is described first.

The First Stage

First, the testing machine 25 provides the working voltage Vw to the DC voltage generators 201 of the circuits 21~24, so that the DC voltage generators 201 of the circuits 21~24 respectively generate the voltages Vin1~Vin4. In the present embodiment, assuming values of the voltages Vin1~Vin4 are respectively 2.64V, 2.53V, 2.33C and 2.15V, though the present invention is not limited thereto. Next, the control unit 211 of the testing machine 25 respectively generates the adjusting signals S1~S4 according to the voltages Vin1~Vin4, so as to respectively control the voltage regulation modules 202 of the circuits 21~24.

As described above, the voltage regulation module 202 of the circuit 21 adjusts the voltage Vin1 to be the voltage Vref1 close to the standard voltage according to the adjusting signal S1 (step S301). In the present embodiment, assuming the standard voltage is the optimal working voltage 2.5V, though the present invention is not limited thereto. In other embodiments, the standard voltage can also have other values. To be specific, in the step S301, the voltage regulation module 202 of the circuit 21 sets the regulation mode thereof to be "0, 1, 0" according to the adjusting signal S1, so as to adjust the 2.65V voltage Vin1 to be the 2.55V voltage Vref1.

Similarly, the voltage regulation modules 202 of the circuits 22~24 adjusts the voltages Vin2~Vin4 to be the voltages Vref2~Vref4 close to the standard voltage according to the adjusting signals S2~S4 (step S302). To be specific, in the step S302, the voltage regulation module 202 of the circuit 22 sets the regulation mode thereof to be "0, 0, 0" according to the adjusting signal S2, so as to maintain the 2.53V voltage Vin2 to be the 2.53V voltage Vref2. Moreover, the voltage regulation module 202 of the circuit 23 sets the regulation mode thereof to be "1, 1, 0" according to the adjusting signal S3, so as to adjust the 2.33V voltage Vin3 to be the 2.48V voltage Vref3. In addition, the voltage regulation module 202 of the circuit 24 sets the regulation mode thereof to be "1, 1, 1" according to the adjusting signal S4, so as to adjust the 2.15V voltage Vin4 to be the 2.35V voltage Vref4.

As described above, the voltage regulation modules 203 of the circuits 21~24 may apply the predetermined regulation mode "0, 0, 0", so as to respectively output the voltages of 2.55V, 2.53V, 2.48V and 2.35V. Consequently, the circuit 21 may apply the 2.55V voltage to simulate whether or not the circuit 21 can work normally under the optimal working voltage. If the circuit 21 can work normally, it represents the circuit 21 can be repaired via the fuse technique, and if the circuit 21 cannot work normally, it represents the circuit 21 has a defect and cannot be shipped, so that purchase of malfunctioned circuits by customers can be avoided. Operations of the circuits 22~24 can be deduced by analogy, and therefore detailed descriptions thereof will not be repeated.

An advantage of the aforementioned method is that voltages applied to the packaged circuits 21~24 can be truly simulated, and therefore whether or not the circuits 21~24 can work normally during an actual application can be accurately presented, so that the testing quality thereof is improved.

Output/input voltages of the voltage regulation modules 202 of the circuits 21~24 are presented in table 4, and output/input voltages of the voltage regulation modules 203 of the circuits 21~24 are presented in table 5.

TABLE 4 output/input voltages of the voltage regulation module 202 of the circuits 21~24

| | Input voltage of the voltage regulation module 202 | Regulation mode of the voltage regulation module 202 | Voltage regulation amount | Output voltage of the voltage regulation module 202 |
|---|---|---|---|---|
| Circuit 21 | 2.65 V | [0, 1, 0] | −0.1 V | 2.55 V |
| Circuit 22 | 2.53 V | [0, 0, 0] | 0 V | 2.53 V |
| Circuit 23 | 2.33 V | [1, 1, 0] | +0.15 V | 2.48 V |
| Circuit 24 | 2.15 V | [1, 1, 1] | +0.2 V | 2.35 V |

TABLE 5 output/input voltages of the voltage regulation module 203 of the circuits 21~24

| | Input voltage of the voltage regulation module 203 | Regulation mode of the voltage regulation module 203 | Voltage regulation amount | Output voltage of the voltage regulation module 203 |
|---|---|---|---|---|
| Circuit 21 | 2.55 V | [0, 0, 0] | 0 V | 2.55 V |
| Circuit 22 | 2.53 V | [0, 0, 0] | 0 V | 2.53 V |
| Circuit 23 | 2.48 V | [0, 0, 0] | 0 V | 2.48 V |
| Circuit 24 | 2.35 V | [0, 0, 0] | 0 V | 2.35 V |

The Second Stage

Next, in the second stage, whether or not the circuits 21~24 can work normally under the margin voltage is simulated. In the second stage, the regulation modes of the voltage regulation modules 202 of the circuits 21~24 can be maintained the same to that of the first state. In the present embodiment, to simulate whether or not the circuits 21~24 can work normally under the margin voltage, only a margin adjusting signal Sma is required to be generated via the control unit 212, so as to control the regulation modes of the voltage regulation modules 203 of the circuits 21~24 together. On the other hand, the circuits 21~24 may adjust the margin ranges of the voltages Vref1~Vref4 together according to the margin adjusting signal Sma (step S303).

For example, to simulate whether or not the circuits 21~24 can work normally under the 2.3V margin voltage, first, the control unit 212 generates the margin adjusting signal Sma for setting the modulation modes of the voltage regulation modules 203 of the circuits 21~24 to be "1, 0, 1" together, so that the voltage regulation modules 203 of the circuits 21~24 may respectively output the voltages of 2.35V, 2.33V, 2.28V and 2.15V. Accordingly, the circuits 21~24 may respectively apply the voltages 2.35V, 2.33V, 2.28V and 2.15V to simulate whether or not the circuits 21~24 can work normally under the 2.3 V margin voltage.

For another example, to simulate whether or not the circuits 21~24 can work normally under the 2.7V margin voltage, first, the control unit 212 generates the margin adjusting signal Sma for setting the modulation modes of the voltage regulation modules 203 of the circuits 21~24 to be "0, 1, 0" together, so that the voltage regulation modules 203 of the circuits 21~24 may respectively output the voltages of 2.75V, 2.73V, 2.68V and 2.55V. Accordingly, the circuits 21~24 may respectively apply the voltages 2.75V, 2.73V, 2.68V and 2.55V to simulate whether or not the circuits 21~24 can work normally under the 2.7 V margin voltage.

An advantage of the aforementioned method is that testing time required for testing the group of the circuits can be greatly reduced. To be specific, in the second stage of the present embodiment, the circuits 21~24 can be tested in parallel, so that testing time thereof is greatly reduced. Besides, the margin voltages applied to the packaged circuits 21~24 can be truly simulated, and therefore whether or not the circuits 21~24 can work normally during an actual application can be accurately presented, so that testing quality thereof is improved. To highlight the testing time saved based on the technique of the present embodiment, the technique of the present embodiment is compared to the conventional technique in the following content.

Figure 1:
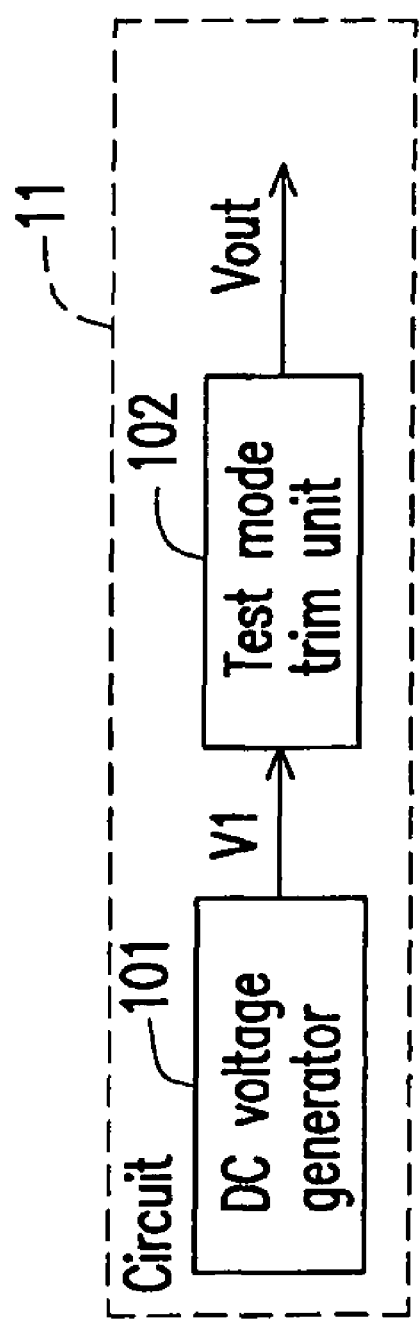
FIG. 1 is a schematic diagram illustrating a conventional method of adjusting voltages of a DC voltage generator via a fuse technique.

Referring to FIG. 1 again, according to the conventional technique, it is known that the total time required for testing the one hundred circuits 11 is 100×(T1+T2). However, if the technique of the present embodiment is applied to the above example, the total time required for testing the one hundred circuits 11 is then (100×T1)+T2. Therefore, it is obvious that the total time required for testing the circuits can be greatly reduced according to the technique of the present embodiment, and meanwhile the testing quality is maintained, for example, defects of the DC voltage generator 101 can be detected. Therefore, the technique of the present embodiment may solve the long-standing problem of the conventional technique.

Referring to FIG. 2, in the present embodiment, only the circuits 21~24 are taken as an example for the group of the circuits, though the present invention is not limited thereto, and in other embodiments, the group of the circuits may also include other number of the circuits.

It should be noted that though a possible example of the group of the circuits and the testing method thereof, and the testing machine thereof is described in the aforementioned embodiment, those skilled in the art should understand that designs of the group of the circuits and the testing method thereof, and the testing machine thereof are different for different manufactures, and therefore the present invention is not limited to such possible example. In other words, as long as a first voltage of a first circuit is adjusted to be a second voltage according to a first adjusting signal, a third voltage of a second circuit is adjusted to be a fourth voltage according to a second adjusting signal, and margin ranges of the second voltage and the fourth voltage are adjusted together according to a margin adjusting signal, it is construed to be within the scope of the present invention. In the following content, several embodiments of the voltage regulation module are provided for reference of those skilled in the art.

Figure 4:
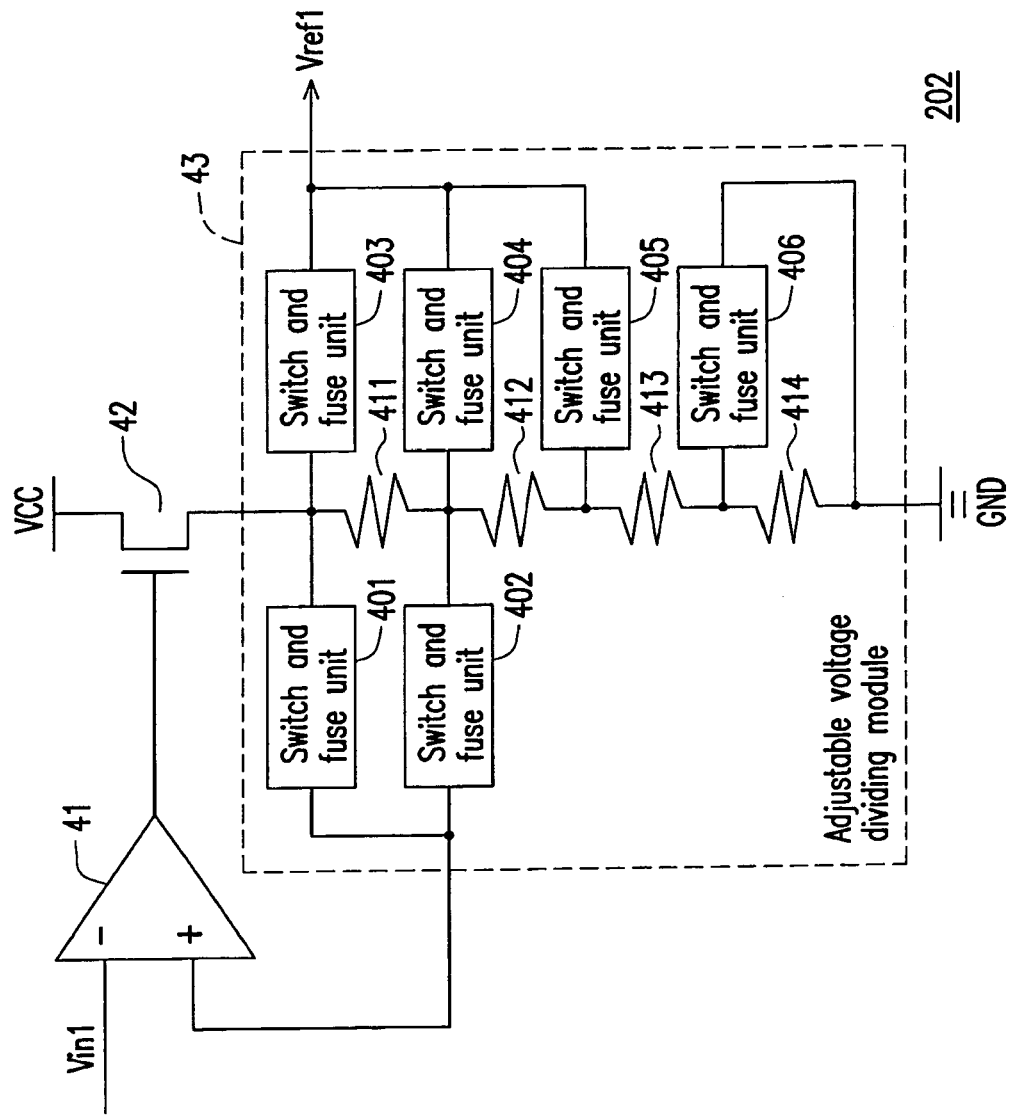
FIG. 4 is a circuit diagram of a voltage regulation module of FIG. 2.

An embodiment of the voltage regulation module 202 of FIG. 2 is provided for those skilled in the art. FIG. 4 is a circuit diagram of a voltage regulation module of FIG. 2. Referring to FIG. 2 and FIG. 4, in the present embodiment, since the voltage regulation modules 202 of the circuits 21~24 are similar, only the voltage regulation module 202 of the circuit 21 is taken as an example, and those skilled in the art may easily deduce the embodiments of the voltage regulation modules 202 of the circuits 22~24.

For convenience, only embodiments for 3 regulation modes of the voltage regulation modules 202 are provided, and those skilled in the art may deduce the embodiments for other number of the regulation modes of the voltage regulation modules 202. The voltage regulation module 202 of the circuit 21 includes an amplifier 41, a transistor 42 and an adjustable voltage dividing module 43. The adjustable voltage dividing module 43 includes switch and fuse units 401~406 and resistors 411~414. The adjustable voltage dividing module 43 respectively determines whether or not the switch and fuse units 401~406 are turned on/off according to the adjusting signal S1, so as to change a coupling state of internal wiring of the adjustable voltage dividing module 43. Such approach is intended to adjust resistance ratios between terminals of the adjustable voltage dividing module 43, so that a third terminal of the adjustable voltage dividing module 43 may output the voltage Vref1.

For example, when the switch and fuse units 401, 405 and 406 are turned on, and the switch and fuse units 402~404 are turned off, the adjustable voltage dividing module 43 is then set to a first regulation mode. When the switch and fuse units 401, 404 and 406 are turned on, and the switch and fuse units 402, 403 and 405 are turned off, the adjustable voltage dividing module 43 is then set to a second regulation mode. When the switch and fuse units 402 and 403 are turned on, and the switch and fuse units 401 and 404~406 are turned off, the adjustable voltage dividing module 43 is then set to a third regulation mode. Consequently, the voltage Vref1 then has three voltage variations. Moreover, the resistances of the resistors 411~414 may also be changed according to actual requirements, so as to generate the voltages Vref1 with different values.

On the other hand, since the switch and fuse units 401~406 respectively includes switches (not shown) and fuses (not shown), not only the switch and fuse units 401~406 can be turned on/off for the testing of the circuit 21 according to the adjusting signal S1, but the fuses of the switch and fuse units 401~406 can also be cut off via a laser technique for fixing the voltage Vref1, so as to reduce a voltage error generated by the DC voltage generator 201.

Figure 5:
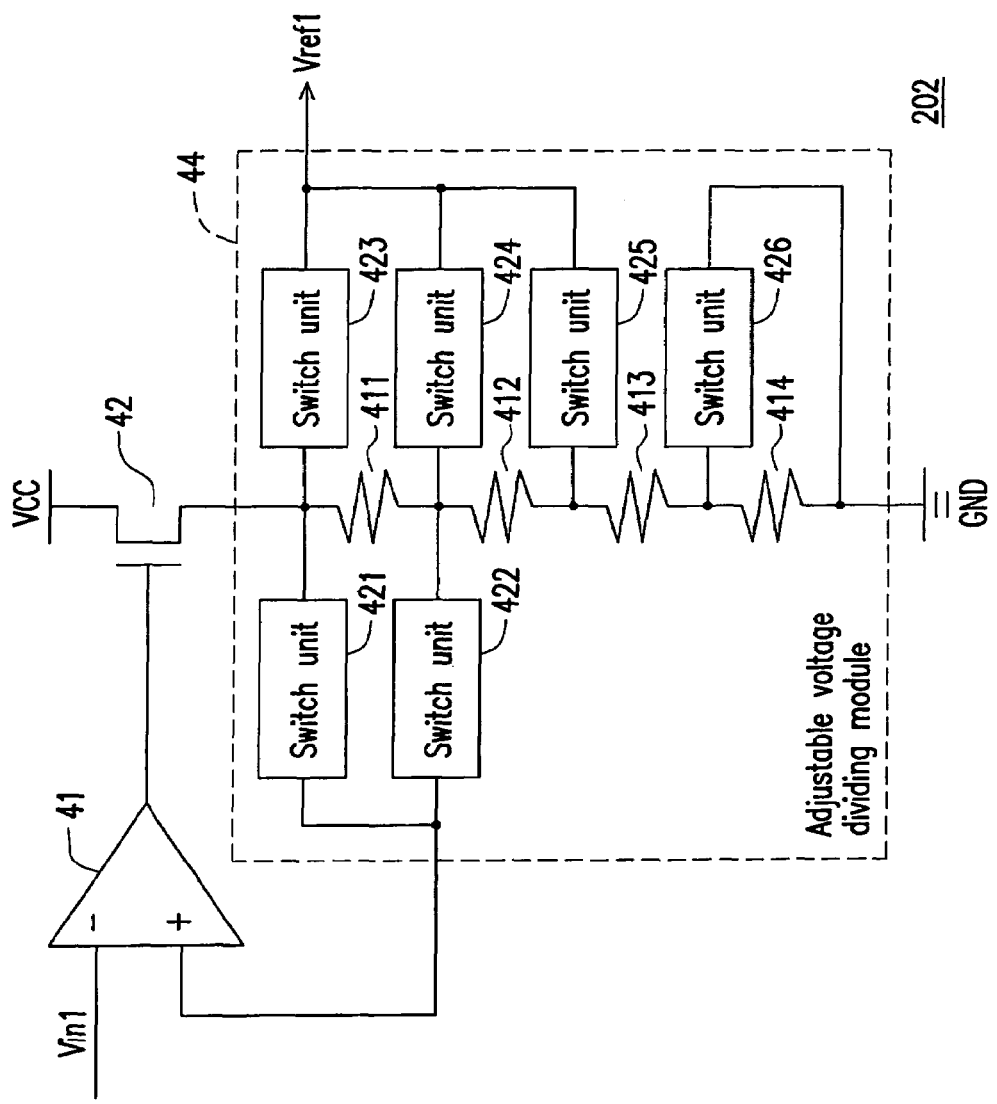
FIG. 5 is another circuit diagram of a voltage regulation module of FIG. 2.

Embodiment of the voltage regulation module 202 can also be changed according to an actual requirement. For example, the switch and fuse units 401~406 of the adjustable voltage dividing module 43 of FIG. 4 can be substituted by switch units. FIG. 5 is another circuit diagram of a voltage regulation module of FIG. 2. Referring to FIG. 2, FIG. 4 and FIG. 5, the adjustable voltage dividing module 44 of FIG. 5 is similar to the adjustable voltage dividing module 43 of FIG. 4, and a difference there between is that the adjustable voltage dividing module 44 of FIG. 5 includes switch units 421~426 and resistors 411~414.

Moreover, the voltage regulation module 203 and the voltage regulation module 202 of FIG. 2 are similar. Therefore, embodiments of the voltage regulation modules 203 of the circuits 21~24 may also be referred to that of FIG. 4 or FIG. 5, and detailed descriptions thereof will not be repeated.

In summary, in the present invention, a first voltage of a first circuit is adjusted to be a second voltage according to a first adjusting signal, wherein the second voltage is closer to a standard voltage compared to the first voltage. Further, a third voltage of a second circuit is adjusted to be a forth voltage according to a second adjusting signal, and the forth voltage is closer to the standard voltage compared to the third voltage. In addition, a margin range of the second voltage and a margin range of the forth voltage are adjusted together according to a margin adjusting signal. By such means, the time spent for testing the first circuit and the second circuit can be reduced, and cost thereof can be saved. Moreover, the present invention at least has the following advantages:

1. In the second stage of the circuit testing (margin voltage testing), time required for testing the circuits can be greatly reduced by utilizing the parallel testing technique, so as to save the cost.

2. The DC voltage generator is applied for the testing, so that defects of the DC voltage generator can be detected, and an actual working status of the circuit can be truthfully simulated, and therefore a yield and testing quality of the circuit is improved.

3. By applying the fuse units to the voltage regulation modules, the voltage error of the DC voltage generator can be repaired via the fuse technique, so as to improve the yield of the circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A group of circuits, comprising:
   a first circuit, comprising:
      a first voltage regulation module, for adjusting a first voltage of the first circuit to be a second voltage according to a first adjusting signal, wherein the second voltage is closer to a standard voltage compared to the first voltage; and
      a second voltage regulation module, coupled to the first voltage regulation module, for adjusting a margin range of the second voltage according to a margin adjusting signal; and
   a second circuit, comprising:
      a third voltage regulation module, for adjusting a third voltage of the second circuit to be a fourth voltage according to a second adjusting signal, wherein the fourth voltage is closer to the standard voltage compared to the third voltage; and
      a fourth voltage regulation module, coupled to the third voltage regulation module, for adjusting a margin range of the fourth voltage according to the margin adjusting signal.

2. The group of circuits as claimed in claim 1 further comprising:
   a third circuit, comprising:
      a fifth voltage regulation module, for adjusting a fifth voltage of the third circuit to be a sixth voltage according to a third adjusting signal, wherein the sixth voltage is closer to the standard voltage compared to the fifth voltage; and
      a sixth voltage regulation module, coupled to the fifth voltage regulation module, for adjusting a margin range of the sixth voltage according to the margin adjusting signal.

3. The group of circuits as claimed in claim 1, wherein the first voltage regulation module comprises:
   an amplifier, having a first input terminal receiving the first voltage;
   an adjustable voltage dividing module, having a first terminal and a second terminal respectively coupled to a second input terminal of the amplifier and a reference voltage, the adjustable voltage dividing module adjusting a resistance ratio between the first terminal to a third terminal thereof and the second terminal to the third terminal according to the first adjusting signal, so as to output the second voltage from the third terminal of the adjustable voltage dividing module; and
   a transistor, having a gate and a first terminal respectively coupled to an output terminal of the amplifier and an external voltage, and a second terminal thereof coupled to a fourth terminal of the adjustable voltage dividing module.

4. The group of circuits as claimed in claim 1, wherein the second voltage regulation module comprises:
   an amplifier, having a first input terminal receiving the second voltage;
   an adjustable voltage dividing module, having a first terminal and a second terminal respectively coupled to a second input terminal of the amplifier and a reference voltage, the adjustable voltage dividing module adjusting a resistance ratio between the first terminal to a third terminal thereof and the second terminal to the third terminal according to the margin adjusting signal, so as to adjust a margin range of the second voltage; and
   a transistor, having a gate and a first terminal respectively coupled to an output terminal of the amplifier and an external voltage, and a second terminal thereof coupled to a fourth terminal of the adjustable voltage dividing module.

5. The group of circuits as claimed in claim 1, wherein the first circuit further comprises:
   a first DC voltage generator, coupled to the first voltage regulation module, for receiving a working voltage to generate the first voltage.

6. The group of circuits as claimed in claim 5, wherein the second circuit further comprises:
   a second DC voltage generator, coupled to the third voltage regulation module, for receiving the working voltage to generate the third voltage.

7. The group of circuits as claimed in claim 1, wherein the first voltage regulation module further comprises:
   a fuse unit, for fixing the first voltage to be the second voltage.

8. The group of circuits as claimed in claim 1, wherein the first circuit and the second circuit have the same elements.

9. A testing method for a group of circuits comprising at least a first circuit and a second circuit, the testing method comprising:
   adjusting a first voltage of the first circuit to be a second voltage according to a first adjusting signal, wherein the second voltage is closer to a standard voltage compared to the first voltage;
   adjusting a third voltage of the second circuit to be a fourth voltage according to a second adjusting signal, wherein the fourth voltage is closer to the standard voltage compared to the third voltage; and
   adjusting a margin range of the second voltage and a margin range of the fourth voltage together according to a margin adjusting signal.

10. A testing machine, for testing a group of circuits comprising at least a first circuit and a second circuit, the testing machine comprising:
   a first control unit, coupled to the first circuit and the second circuit for generating a first adjusting signal according to a first voltage of the first circuit, wherein the first circuit adjusts the first voltage to be a second voltage according to the first adjusting signal, and the second voltage is closer to a standard voltage compared to the first voltage, moreover, the first control unit generates a second adjusting signal according to a third voltage of the second circuit, wherein the second circuit adjusts the third voltage to be a fourth voltage according to the second adjusting signal, and the fourth voltage is closer to the standard voltage compared to the third voltage; and a second control unit, coupled to the first circuit and the second circuit, for generating a margin adjusting signal to adjust a margin range of the second voltage and a margin range of the fourth voltage together.

* * * * *